(12) United States Patent
McRory

(10) Patent No.: US 6,590,451 B2
(45) Date of Patent: Jul. 8, 2003

(54) RF AMPLIFIER WITH FEEDBACK BASED LINEARIZATION

(75) Inventor: John G. McRory, Calgary (CA)

(73) Assignee: Telecommunications Research Lab. (CA)

(*) Notice: Subject to any disclaimer, the term of this patent is extended or adjusted under 35 U.S.C. 154(b) by 0 days.

(21) Appl. No.: 10/035,483

(22) Filed: Oct. 26, 2001

(65) Prior Publication Data

US 2002/0089374 A1 Jul. 11, 2002

Related U.S. Application Data

(60) Provisional application No. 60/245,190, filed on Nov. 3, 2000.

(51) Int. Cl.$^7$ .................................................. H03F 1/26
(52) U.S. Cl. ........................ 330/149; 330/107; 455/63; 375/297
(58) Field of Search ................. 330/107, 149; 455/63; 375/297

(56) References Cited

U.S. PATENT DOCUMENTS

| | | | |
|---|---|---|---|
| 3,900,823 A | 8/1975 | Sokal et al. | 330/149 |
| 4,276,514 A | 6/1981 | Huang | 330/149 |
| 4,453,133 A | 6/1984 | Travis | 330/149 |
| 4,929,906 A | 5/1990 | Voyce et al. | 330/149 |
| 5,237,288 A | 8/1993 | Cleaveland | 330/107 |
| 5,396,189 A | 3/1995 | Hays | 330/149 |
| 5,745,006 A | 4/1998 | Budnik et al. | 330/149 |
| 5,783,968 A | 7/1998 | Melton | 330/107 |
| 5,808,511 A | 9/1998 | Kobayashi | 330/149 |
| 6,166,601 A * | 12/2000 | Shalom et al. | 330/151 |
| 6,356,146 B1 * | 3/2002 | Wright et al. | 330/2 |
| 2002/0089374 A1 * | 7/2002 | McRory | 330/149 |

OTHER PUBLICATIONS

Cavers "Amplifier Linearization Using a Digital Predistorter with Fast Adaptation and Low Memory Requirements" Vehicular Technology, IEEE Transactions on, vol. 39 Issue 4, Nov. 1990 pp 374–382.*

J.G. McRory and R.H. Johnston, "An RF Amplifier for Low Intermodulation Distortion" 1994 IEEE MTT–S Digest, pp. 1741–1744.

M. Faulkner and M.A. Briffa, "Amplifier Linearisation Using RF Feedback and Feedforward Techniques", 1995 IEEE VTC Proceedings, pp. 525–529.

R.G. Villanueva and H.J. Aguilar, "Amplifier Linearisation Through the Use of Special Negative Linear Feedback," IEE Proceedings, Circuits, Devices, and Systems, vol. 143, No. 1, Feb. 1996, pp. 61–67.

J.S. Kenney and A. Leke, "Power Amplifier Spectral Regrowth for Digital Cellular and PCS Applications", Microwave Journal, Oct. 1995, pp. 74–92.

A. Lieke and J.S. Kenney, "Behavioral Modeling of Narrowband Microwave Power Amplifiers with Applications in Simulating Spectrum Regrowth", IEE MTT–S Digest, 1996, pp. 1385–1388.

* cited by examiner

*Primary Examiner*—Michael B Shingleton
(74) *Attorney, Agent, or Firm*—Robert L. Shaver; Frank J. Dykas; Stephen M. Nipper

(57) ABSTRACT

A complex baseband model of the power amplifier within a DSP domain is used to develop a feedback signal that would be equivalent to the optimum negative feedback used for the analog amplifier. Once the feedback signal is available, it can be processed to compensate for the effects of the group delay and for optimum loop gain, hence resulting in a broadband response with no theoretical limitations on the linearization of the amplifier.

8 Claims, 3 Drawing Sheets

RF AMPLIFIER WITH FEEDBACK BASED LINEARIZATION

PRIORITY

This application claims the benefit of priority of provisional application No. 60/245,190 filed on Nov. 3, 2000.

BACKGROUND OF THE INVENTION

This invention relates to the reduction of intermodulation distortion in broadband linear RF power amplifiers. More specifically, it relates to the cancellation of the intermodulation distortion through the application of a DSP based negative feedback derived error signal at the input of the amplifier.

There have been several different techniques developed for the linearization of nonlinear RF circuitry, in particular the reduction of in-band intermodulation distortion produced by high frequency linear power amplifiers. These methods may be characterized as one of feed forward, feedback or pre-distortion correction. For low frequency applications, negative feedback has clearly been the linearization technique of choice, but in high frequency circuits the application of negative feedback has been limited.

The use of traditional analog negative feedback has several performance penalties. The distortion products are reduced by an amount equivalent to the loop gain, but so is the gain of the amplifier. At lower frequencies high gain devices are common, but at RF frequencies the gain of the available active devices is low, so as a result more stages may be required for a given gain requirement. Another issue is the amount of time delay inherent in the feedback loop. This delay, which may be sufficient for several cycles of the RF signal, results in a frequency dependent phase shift within the feedback loop. This additional phase has two effects on the performance of the amplifier: first it reduces the bandwidth over which the negative feedback is effective, and secondly it tends to make the amplifier more unstable and thereby reduces the amount of loop gain that can be used. Several techniques have been disclosed in the prior art to improve the performance of the negative feedback amplifier.

N. Sokal et al., U.S. Pat. No. 3,900,823 on "Amplifying and Processing Apparatus for Modulated Carrier Signals", issued Aug. 19, 1975, propose a method for linear amplification of single side-band modulated signals. A negative feedback signal is developed by taking the difference between the amplifier's modulated input and output signals, and then using that error signal to adjust an amplifier's gain by controlling the input power supply voltage. This circuit is successful for narrow band modulation only.

M. Y. Huang, U.S. Pat. No. 4,276,514 on "Wideband, Phase Compensated Amplifier with Negative Feedback of Distortion Components in the Output Signal", issued Jun. 30, 1981, discloses a negative feedback technique for RF power amplifiers by which the input signal is removed from the feedback loop such that only the distortion components remain in the loop. As a result, the gain of the amplifier is unaffected while the distortion products are reduced by an amount equivalent to the loop gain. Huang attempts to address the effect of the time delay in the feedback loop by adding delay equalization into the loop, however the circuit remains narrow band in nature. A second performance penalty is in the addition of a power divider at the circuit input in order to feed the input signal into the cancellation circuit for the loop. The additional loss caused by the divider reduces the gain of the overall circuit, although not as much as would be expected from the loop gain. This particular circuit has been independently disclosed several times in the literature, by McRory and Johnston (1993), Faulkner and Briffa (1995), and Villanueva and Aguilar (1996).

The cancellation of the input signal from the feedback loop was also implemented by L. V. Hayes (U.S. Pat. No. 5,396,189, "Adaptive Feedback System", issued Mar. 7, 1995), who made the system adaptive, and by B. J. Budnik (U.S. Pat. No. 5,745,006, "Method of Compensating for Distortion in an Amplifier", issued Apr. 28, 1998), who included adaptive pre-distortion.

The effect of the loop delay has also been addressed. K. G. Voyce et al., U.S. Pat. No. 4,929,906, "Amplifier Linearization Using Down/Up Conversion", issued May 29, 1990, teaches of a method that performs the negative feedback at IF frequencies. In this case, both the input signal and the amplifier's output signal are down converted to an IF frequency. The effect of the loop delay at the IF frequency is minimized as the resulting phase shift is much smaller at the lower frequency, potentially increasing the amplifier's stability and hence increasing the available loop gain. However, the addition of up and down conversion in the loop greatly increases the complexity of the circuit and will introduce conversion loss into the loop, requiring a larger PA for equivalent output power.

J. F. Cleveland, U.S. Pat. No. 5,237,288, "RF Power Amplifier Linearization", issued Aug. 17, 1993, discloses a method of optimizing the negative feedback by correcting the phase transfer function of the feedback loop such that it operates at the required $\pi$ radians phase shift for each operating frequency. Although this method optimizes the negative feedback condition, it cannot improve the amplifier's stability and hence the maximum loop gain available in this case is 6 dB.

J. R. Melton, U.S. Pat. No. 5,783,968, "RF Amplifier Method and Apparatus", issued Jul. 21, 1998, discloses a method in which the down/up conversion technique and the tuning of the feedback loops phase response is combined. In this case the feedback and error signal derivation is performed at RF frequencies, but the error signal is then down converted at processed at baseband. The amplifier is tuned during a stabilization phase during which the phase transfer function of the loop is set to the optimum condition.

When considering the prior art, it is clear that the use of negative feedback in the linearization of high frequency circuits is limited in its effective bandwidth and in the amount of loop gain available due to stability consideration. Furthermore, the prior art shows that in order to improve the performance of the negative feedback, additional circuitry is required that contributes its own performance penalty in loss, additional distortion, and reduced system efficiency.

SUMMARY OF THE INVENTION

A principal object of this invention is to provide a DSP based negative feedback derived linearization technique that will reduce intermodulation distortion, will not require additional RF hardware, will be capable of linearizing an entire transmit chain, is easily trainable for adaptive applications, and is broadband in capability.

Although analog circuitry can be used to improve the performance of negative feedback, the application of DSP technology offers a better solution for the linearization of a broadband amplifier. The basic idea of the invention is to use a complex baseband model of the power amplifier within a DSP domain to develop a feedback signal that would be equivalent to the optimum negative feedback used for the analog amplifier. Once the feedback signal is available, it can be processed to compensate for the effects of the group delay and for optimum loop gain, hence resulting in a broadband response with no theoretical limitations on the linearization of the amplifier.

Therefore, according to an aspect of the invention, there is provided apparatus for achieving RF amplification while reducing intermodulation distortion, the apparatus comprising an amplifier having an input and an output; and a processor incorporating a model of the amplifier, the processor having an output connected to the input of the amplifier such that the output of the processor comprises a desired input signal of the amplifier combined with a broadband feedback error signal to reduce the intermodulation distortion of the amplifier.

Preferably, the processor comprises a complex baseband model of the amplifier that replicates the output complex envelope of the amplifier in the absence of combination of the input of the amplifier with the broadband feedback error signal.

In a further aspect of the invention, there may be provided a first multiplier to apply a gain of $1+\alpha$ to the input signal which is then combined with the error signal and fed to the amplifier. In a further aspect of the invention, there may be provided a second multiplier to apply a gain of $\alpha$ to the input signal which is fed to the complex baseband model; and a third multiplier to apply a gain of $\beta$ to the output of the complex baseband model such that the scaled output of the model is equivalent to a broadband feedback error signal which is then combined with the scaled input signal to form the output of the processor.

In a further aspect of the invention, there may be provided, on the input to the amplifier after the output of the processor, a digital to analog converter followed by an anti-aliasing filter; and an up converter followed by a bandpass filter. The amplifier may be a feed-forward amplifier, and the amplifier and the model may be contained in an up-converter and transmit chain. Preferably, the model is adaptive to the thermal condition of the amplifier. The output of the amplifier may also applied to the model for training the model.

BRIEF DESCRIPTION OF DRAWINGS

There will now be described preferred embodiments of the invention, with reference to the drawings by way of illustration, in which like reference characters denote like elements and in which.

DETAILED DESCRIPTION OF PREFERRED EMBODIMENTS

Figure 2:
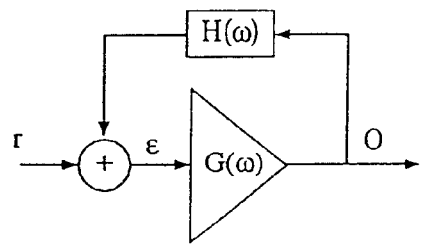
FIG. 2 depicts a system level diagram of a negative feedback amplifier.

FIG. 2 shows a typical system level schematic for a negative feedback circuit. When implemented at high frequencies the transfer function of this circuit may be written as $$\frac{o}{r} = \frac{G(\omega)}{1 - G(\omega)H(\omega)} \quad (1)$$

Figure 3:
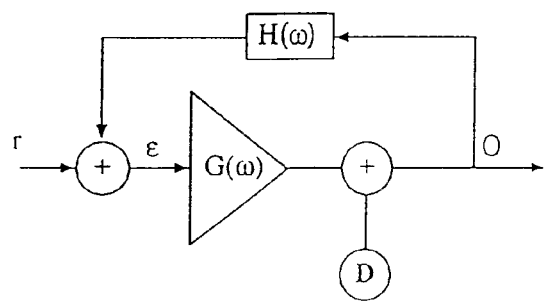
FIG. 3 depicts a system level diagram of a negative feedback amplifier with additive distortion.

(1) differs from the form usually encountered in control theory analysis in that the denominator contains a subtraction rather than an addition. This is a result of having to use adders at high frequencies rather than difference circuits to form the error signal $\epsilon$. If it is assumed that the amplifier's intermodulation distortion can be adequately represented as an additive process, then the linear analysis techniques can be applied to negative feedback around a nonlinear device such as a power amplifier. FIG. 3 shows the case in which the amplifier distortion D is represented as being simply added to the output of the amplifier. In this case the transfer function of the circuit is more complex as given in (2).

$$O = \frac{rG(\omega)}{1 - G(\omega)H(\omega)} + \frac{D}{1 - G(\omega)H(\omega)} \quad (2)$$

From (2) it's clear that both the distortion and the amplifier's gain are reduced by the loop gain.

Figure 4:
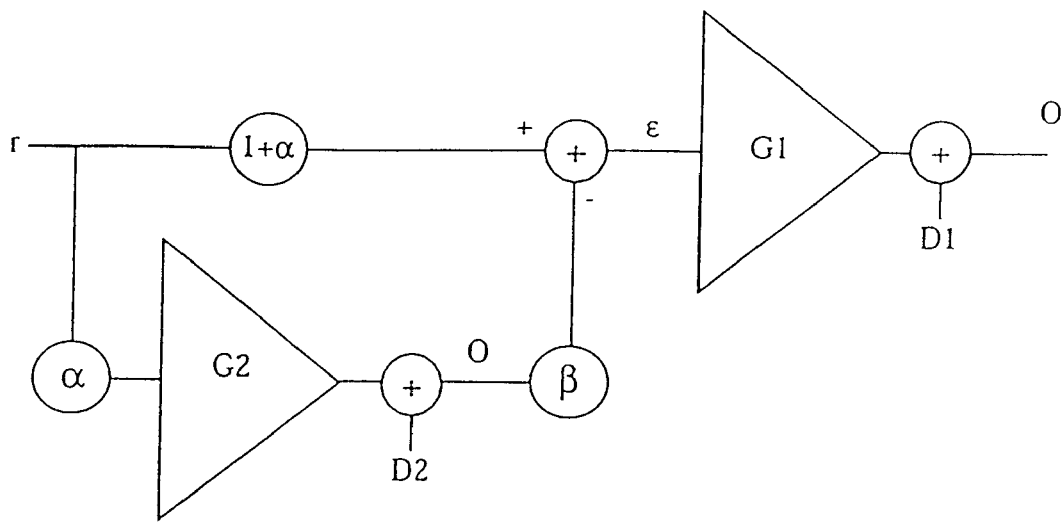
FIG. 4 depicts a system level diagram of the present invention.

A system level diagram of the invention is shown in FIG. 4, in which $D_1$ and $D_2$ are the in-band intermodulation distortion products added at the output of the amplifiers, $G_1$ and $G_2$ are nonlinear amplifiers, $\alpha$ is a complex scaling factors, O and O' are the amplifier output and the complex baseband model output respectively, $\beta$ is the feedback loop response, and $\epsilon$ is the feedback derived error signal.

The error signal $\epsilon$ in FIG. 4 can be written as $$\epsilon = r(1+\alpha) - \beta(r\alpha G_2 + D_2) \quad (3)$$

and $$o = \epsilon G_1 + D_1 \quad (4)$$

Substitution of (3) into (4) yields $$o = G_1[r(1+\alpha) - \beta r\alpha G_2 - \beta D_2] + D_1 \quad (5)$$

which can be simplified to $$o = rG_1(1+\alpha-\beta\alpha G_2) + (D_1 - \beta D_2 G_1) \quad (6)$$

Now if we assume that the amplifier and its model are identical, then $G_1=G_2=G$ and $D_1=D_2=D$, then (6) simplifies to (7).

$$o = rG(1+\alpha-\beta\alpha G) + D(1-\beta G) \quad (7)$$

Finally if $\beta$ is chosen such that $\beta=1/G$, then (7) reduces to $$o = rG \quad (8)$$

Although (8) is trivial, it shows that in theory it is possible to remove all of the in-band intermodulation products through the proper choice of $\beta$.

Figure 1:
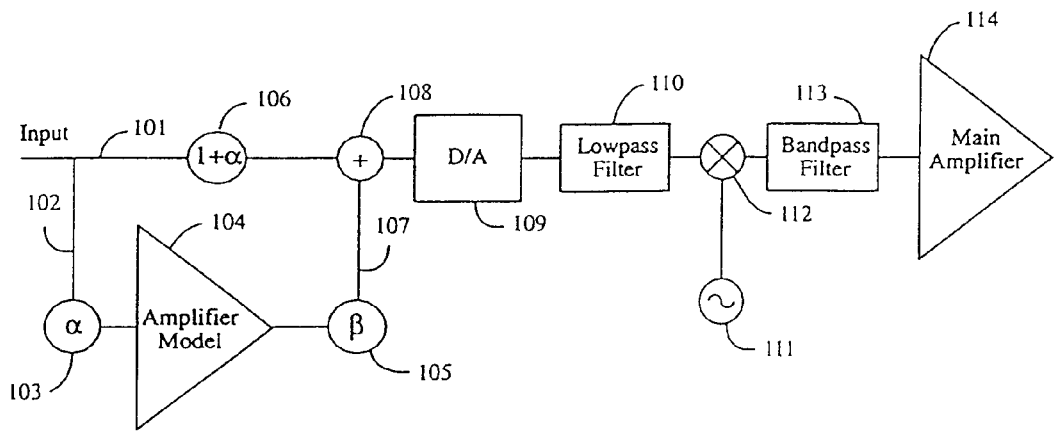
FIG. 1 depicts an embodiment of the present invention.

FIG. 1 shows an embodiment of the invention. A digitally modulated input signal is split into two paths, an upper path 101 and a lower path 102. The upper path 101 is fed to a multiplier 106 which multiplies the signal level by a factor of $(1+\alpha)$, while the lower path 101 is fed to a multiplier 103 which scales the amplitude by a factor of $\alpha$, where $\alpha$ is chosen such that the resulting signal amplitude is the same as that of the signal entering the main power amplifier 114.

The lower path scaled signal is fed to a complex base band model 104 of the main power amplifier 114. The base band output of the model 104 replicates the modulation output of the main power amplifier, including the input signal and the intermodulation distortion. The output of the amplifier model is fed to a multiplier 105 which scales the output signal by a complex factor of β resulting in signal 107, where β is chosen as the optimum value for the feedback loop coefficient which would be used for a negative feedback loop around the main power amplifier 114. Signal 107 and the output of multiplier 106 are combined in adder 108 such that the output of the adder 108 contains the original input signal and the scaled distortion from the amplifier model.

The output of the adder is then passed through a digital to analog converter 109, a lowpass anti-aliasing filter, and up-converted and filtered using the mixer 112, local oscillator 111 and a bandpass filter 113. The signal arriving at the input of the main power amplifier 114 may now be considered as being equivalent to the optimum feedback signal, and acts in such a fashion to reduce the intermodulation distortion of the amplifier without affecting its gain.

Figure 5:
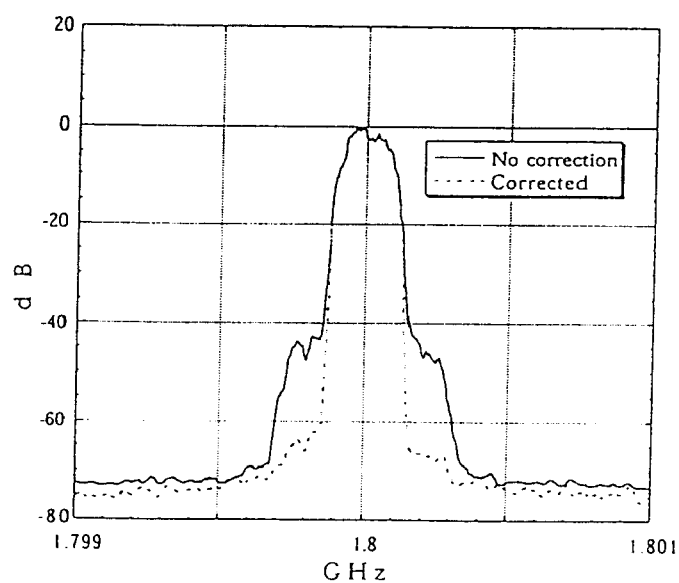
FIG. 5 is a graph illustrating the improvement achieved with this invention.
Figure 6:
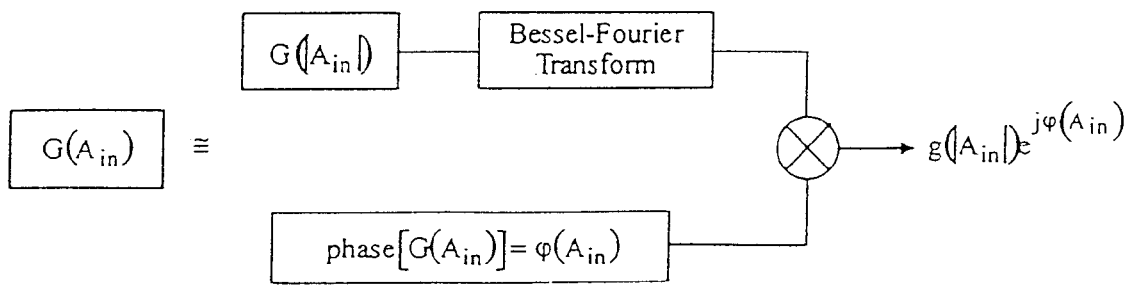
FIG. 6 shows a model of an amplifier for use in an embodiment of the invention.

As a proof of concept, the circuit shown in FIG. 6 was implemented using an arbitrary function generator to generate the waveforms, which were in turn calculated in MATLAB. A complex baseband model of a Minicircuits amplifier was generated, and a ODQPSK waveform was used with a bandwidth of 400 kHz. The center frequency of the amplifier was 1.8 GHz. FIG. 5 shows the amplifier's spectral content for the corrected and uncorrected waveforms.

Nonlinear Amplifier System Modeling

Nonlinear amplifiers can be characterized by two different but related transfer characteristics. The first is the voltage transfer characteristic, which is the complex input/output voltage transfer function for the amplifier for a single frequency. This is the transfer function commonly measured using a network analyzer. The second is the nonlinear envelope transfer characteristic in which the amplifier distortion is represented through the complex envelope of the signal.

These transfer characteristics are identical in the linear region of operation of the amplifier, but differ as the amplifier saturates. The source of this difference is best understood if the output voltage of the amplifier is considered in the form of a Fourier series. The voltage transfer function is a measure of the fundamental or first term of the series, while the envelope function is represented by the entire series. It is well understood that in a saturating system the peak amplitude of the fundamental term can be higher than the saturation level by as much as a factor of $4/\pi$. The problem is that while the voltage transfer function is easily measured, it does not give a good estimation of the amplifier's nonlinear distortion for modern communication signals, but the envelope transfer characteristic does. So the problem becomes how to relate the amplifier's AM/AM and AM/PM voltage measurements to the envelope transfer characteristic, and then to develop a model to predict the amplifier's nonlinear distortion products.

We will focus on the non-linear envelope model as first proposed by Kaye et. al. and refined by Kenney and Leke. This model is a quadrature based system that includes the AM/AM distortion products only as the AM/PM product are shown to affect only the higher intermodulation products.

Figure 7:
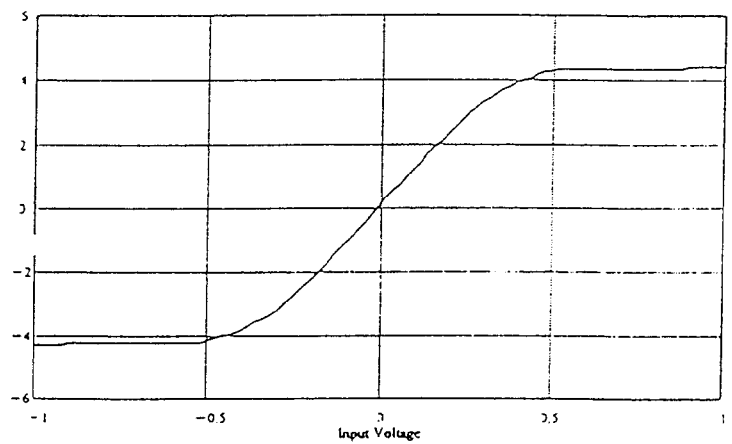
FIG. 7 is a graph showing an envelope transfer characteristic for an amplifier.

The Bessel-Fourier transform supplies the link between the voltage gain and envelope transfer functions. Since only the in-band distortion products are required, the envelope transfer function can be represented as an odd order function expanded as a Fourier sine series. FIG. 7 shows a graphical representation of an envelope transfer function with the saturation characteristic clearly shown, where:

$$g(|A_{in}|) = a_1\sin(\xi|A_{in}|) + a_3\sin(3\xi|A_{in}|) + a_5\sin(5\xi|A_{in}|)\ldots \text{ where } \xi = \frac{\pi}{2\max(|A_{in}|)}$$

Now if we consider a single tone saturation test of the amplifier which is used to measure the voltage transfer function, for a given input tone $A_{in}\sin(\omega t)$, we can determine the amplifier output by substitution into the Fourier series, so for the single tone input the gain function can be represented as $$g(\xi A_{in}\sin(\omega t)) = a_1\sin[\xi A_{in}\sin(\omega t)] + a_3\sin[3\xi A_{in}\sin(\omega t)] - $$

Now we assume that the envelope transfer characteristic is represented as a Fourier sine transform:

$$A_{out} = F_s[g(|A_{in}|)] = \frac{1}{T}\int_0^T g(|A_{in}|)\sin(\omega t)\,dt$$

Now, substitute the expansion for the envelope transfer characteristic giving $$A_{out} = \frac{1}{T}\int_0^T g(|A_{in}|)\sin(\omega t)\,dt$$

$$= \frac{1}{T}\int_0^T a_1\sin[\xi A_{in}\sin(\omega t)]\sin(\omega t)\,dt +$$

$$\frac{1}{T}\int_0^T a_3\sin[3\xi A_{in}\sin(\omega t)]\sin(\omega t)\,dt + \ldots$$

This is not a very useful form until we notice the similarity between the terms and an identity given for the Bessel function of the first kind:

$$J_{2k+1}(t) = \frac{1}{\pi}\int_0^\infty \sin[(2k+1)\phi]\sin[t\sin(\phi)]\,d\phi$$

With a change of variables the identity can be applied to each of the terms of the output voltage expansion resulting in:

$$A_{out}(A_{in}) = a_1 J_1(\xi A_{in}) + a_3 J_1(3\xi A_{in}) + a_5 J_1(5\xi A_{in}) +$$

The exciting thing about this is that the coefficients for this series, the Bessel series fit for the measured voltage transfer function, are the same as for the Fourier sine series expansion of the envelope transfer characteristic. So, we can use the single tone AM/AM and AM/PM measurements to predict the envelope transfer characteristic resulting in a non-linear model capable of predicting the amplifier's distortion.

Immaterial modifications may be made to the embodiments described here without departing from the essence of the invention.

I claim:

1. An apparatus for achieving RF amplification while reducing intermodulation distortion, the apparatus comprising:

an amplifier having an input and an output;

a processor incorporating a model of the amplifier, said processor having an output connected to the input of the amplifier such that the output of the processor comprises a desired input signal of the amplifier combined with a broadband feedback error signal to reduce the intermodulation distortion of the amplifier, and a first multiplier configured to apply a gain of $1+\alpha$ to the input signal which is then combined with the error signal and fed to the amplifier.

2. The apparatus of claim 1 in which the processor comprises a complex baseband model of the amplifier that replicates the output complex envelope of the amplifier in the absence of combination of the input of the amplifier with the broadband feedback error signal.

3. The apparatus of claim 2 further comprising a second multiplier to apply a gain of $\alpha$ to the input signal which is fed to the complex baseband model; and a third multiplier to apply a gain of $\beta$ to the output of the complex baseband model such that the scaled output of the model is equivalent to a broadband feedback error signal which is then combined with the scaled input signal to form the output of the processor.

4. The apparatus of claim 3 further comprising, on the input to the amplifier after the output of the processor:

a digital to analog converter followed by an anti-aliasing filter; and an up converter followed by a bandpass filter.

5. The apparatus of claim 1 in which the amplifier is a feed-forward amplifier.

6. The apparatus of claim 1 in which the amplifier and the model is contained in an up-converter and transmit chain.

7. The apparatus of claim 1 in which the model is adaptive to the thermal condition of the amplifier.

8. The apparatus of claim 1 in which the output of the amplifier is applied to the model for training the model.

* * * * *